US011444104B2

(12) United States Patent
Lin et al.

(10) Patent No.: US 11,444,104 B2
(45) Date of Patent: Sep. 13, 2022

(54) TOUCH DISPLAY DEVICE

(71) Applicant: InnoLux Corporation, Miao-Li County (TW)

(72) Inventors: Hsiao-Lang Lin, Miao-Li County (TW); Jui-Jen Yueh, Miao-Li County (TW); Chao-Hsiang Wang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/033,666

(22) Filed: Sep. 25, 2020

(65) Prior Publication Data

US 2021/0013241 A1 Jan. 14, 2021

Related U.S. Application Data

(63) Continuation of application No. 15/448,592, filed on Mar. 3, 2017, now Pat. No. 10,825,839.

(Continued)

(51) Int. Cl.
*G06F 3/041* (2006.01)
*G02F 1/1333* (2006.01)
(Continued)

(52) U.S. Cl.
CPC ........ *H01L 27/1225* (2013.01); *G02F 1/1368* (2013.01); *G02F 1/13338* (2013.01);
(Continued)

(58) Field of Classification Search
CPC ............... H01L 27/1225; H01L 27/323; H01L 27/3276; H01L 27/1222; H01L 27/124; H01L 27/1251; H01L 29/24; H01L 29/42356; H01L 29/78648; H01L 29/78675; H01L 29/7869; H01L 29/78696; H01L 27/1248; H01L 27/1255; H01L 27/3262; H01L 29/4908; H01L 29/78672;
(Continued)

(56) References Cited

U.S. PATENT DOCUMENTS

2014/0333555 A1* 11/2014 Oh ........................ G06F 3/0446
345/173
2015/0077361 A1* 3/2015 Seo ........................ G06F 3/0443
345/173

(Continued)

*Primary Examiner* — Patrick N Edouard
*Assistant Examiner* — Joseph P Fox
(74) *Attorney, Agent, or Firm* — Winston Hsu

(57) ABSTRACT

A touch display device includes a substrate, first light emitting units, second light emitting units, an insulation layer, and mesh units. The first and the second light emitting units are disposed on the substrate. The second light emitting units are greater than the first light emitting units in area. The insulation layer is disposed on the first and the second light emitting units. The mesh units are disposed on the insulation layer. Each of the mesh units has a mesh frame and a mesh opening. At least one of the first light emitting units and at least one of the second light emitting units are disposed in the mesh opening respectively. A gap is disposed between a first end portion of at least one of the mesh frames and a second end portion of the mesh frame, and the first end portion is electrically connected to the second end portion.

10 Claims, 7 Drawing Sheets

Related U.S. Application Data

(60) Provisional application No. 62/429,162, filed on Dec. 2, 2016.

(51) Int. Cl.

| | | |
|---|---|---|
| *H01L 27/12* | (2006.01) | |
| *G02F 1/1343* | (2006.01) | |
| *H01L 27/32* | (2006.01) | |
| *H01L 29/24* | (2006.01) | |
| *H01L 29/423* | (2006.01) | |
| *H01L 29/786* | (2006.01) | |
| *G02F 1/1368* | (2006.01) | |
| *H01L 29/49* | (2006.01) | |

(52) U.S. Cl.
CPC .. *G02F 1/133345* (2013.01); *G02F 1/134309* (2013.01); *G06F 3/0412* (2013.01); *H01L 27/124* (2013.01); *H01L 27/1222* (2013.01); *H01L 27/1248* (2013.01); *H01L 27/1251* (2013.01); *H01L 27/1255* (2013.01); *H01L 27/323* (2013.01); *H01L 27/3276* (2013.01); *H01L 29/24* (2013.01); *H01L 29/42356* (2013.01); *H01L 29/7869* (2013.01); *H01L 29/78648* (2013.01); *H01L 29/78675* (2013.01); *H01L 29/78696* (2013.01); *G02F 1/13685* (2021.01); *G02F 1/133388* (2021.01); *H01L 27/3262* (2013.01); *H01L 29/4908* (2013.01); *H01L 29/78672* (2013.01)

(58) Field of Classification Search
CPC ............. H01L 27/1214; H01L 27/3244; G02F 1/133345; G02F 1/13338; G02F 1/134309; G02F 1/1368; G02F 1/13685; G02F 1/133388; G06F 3/0412; G06F 3/0418; G06F 3/047; G06F 2203/04103
See application file for complete search history.

(56) References Cited

U.S. PATENT DOCUMENTS

| | | | |
|---|---|---|---|
| 2015/0109246 A1* | 4/2015 | Lee | G06F 3/044 345/174 |
| 2015/0346866 A1* | 12/2015 | Kusunoki | G06F 3/04166 345/174 |
| 2016/0043109 A1* | 2/2016 | Nam | H01L 27/1262 257/72 |
| 2017/0285787 A1* | 10/2017 | Maeng | G06F 3/041 |

* cited by examiner

TOUCH DISPLAY DEVICE

CROSS REFERENCE TO RELATED APPLICATIONS

This application is a continuation of application Ser. No. 15/448,592 filed on Mar. 3, 2017, which claims the benefit of U.S. Provisional Patent Application No. 62/429,162, filed on Dec. 2, 2016, and the entire content of which is hereby incorporated by reference.

BACKGROUND OF THE DISCLOSURE

1. Field of the Disclosure

The present disclosure relates to a touch display device, and more particularly, to a touch display device including mesh units.

2. Description of the Prior Art

In recent years, touch sensing technologies have developed rapidly. There are many consumer electronics integrated with touch sensing functions, such as mobile phones, GPS navigator systems, tablet PCs, and laptop PCs. Those consumer electronics are mainly characterized by integrating original display functions with touch sensing functions, so as to perform as a touching display device. In conventional resistance touch technology or capacitive touch technology, the sensing electrode for detecting touching signals are usually made of indium tin oxide (ITO), in order to avoid the interference to display functions. However, due to the high electrical resistivity of the indium tin oxide in comparison with metal conductive materials, the sensing electrode made of indium tin oxide may lead to higher integrated resistance and be poor in reaction rate. Therefore, a metal mesh consisted of interweaved metal wires are developed in related arts to replace indium tin oxide for increasing the reaction rate. However, the display light will be partially blocked by the metal mesh, and the display effect may be influenced by the metal mesh in the touch display device.

SUMMARY OF THE DISCLOSURE

It is one of the objectives of the present disclosure to provide a touch display device. Light emitting units are disposed in mesh openings of mesh units for reducing the influence of the mesh units on the display performance of the light emitting units. At least two of the mesh openings have different areas A touch display device is provided in an embodiment of the present disclosure. The touch display device includes a substrate, a plurality of first light emitting units, a plurality of second light emitting units, an insulation layer, and a plurality of mesh units. The plurality of first light emitting units and the plurality of second light emitting units are disposed on the substrate. The plurality of second light emitting units are greater than the plurality of the first light emitting units in area. The insulation layer is disposed on the plurality of first light emitting units and the plurality of second light emitting units. The plurality of mesh units are disposed on the insulation layer. Each of the mesh units has a mesh frame and a mesh opening. At least one of the plurality of first light emitting units and at least one of the plurality of second light emitting units are disposed in the mesh opening respectively in a direction perpendicular to the substrate. At least one of the plurality of mesh frames includes a first end portion, a second end portion opposite to the first end portion, a first mesh corner, a second mesh corner adjacent to the first mesh corner, and a first line portion disposed between the first mesh corner and the first end portion. A gap is disposed between the first end portion and the second end portion, the gap is disposed between the first mesh corner and the second mesh corner, and the first end portion is electrically connected to the second end portion.

These and other objectives of the present disclosure will no doubt become obvious to those of ordinary skill in the art after reading the following detailed description of the embodiment that is illustrated in the various figures and drawings.

DETAILED DESCRIPTION

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

Figure 1:
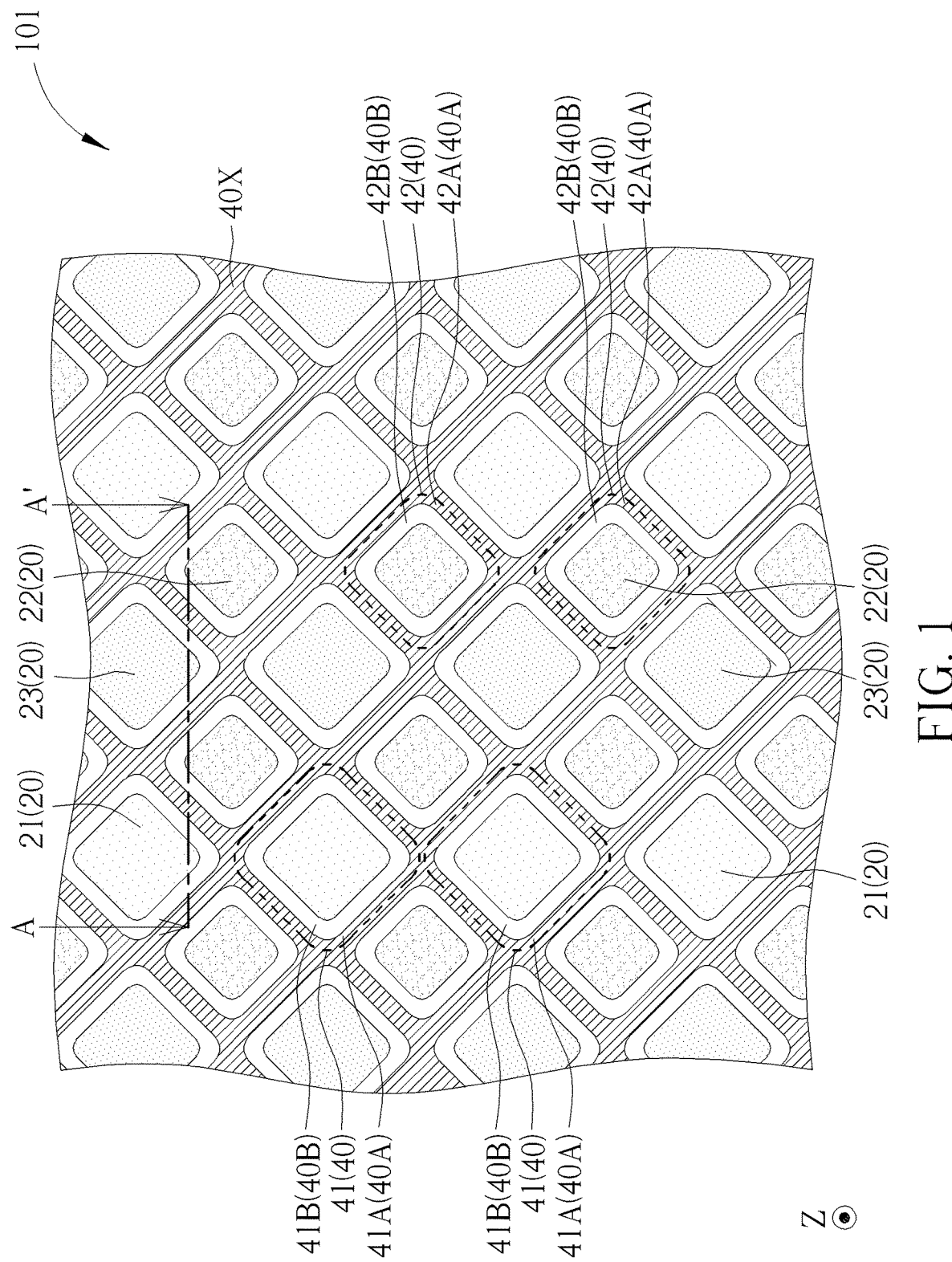
FIG. 1 is a schematic drawing illustrating a touch display device according to a first embodiment of the present disclosure.
Figure 2:
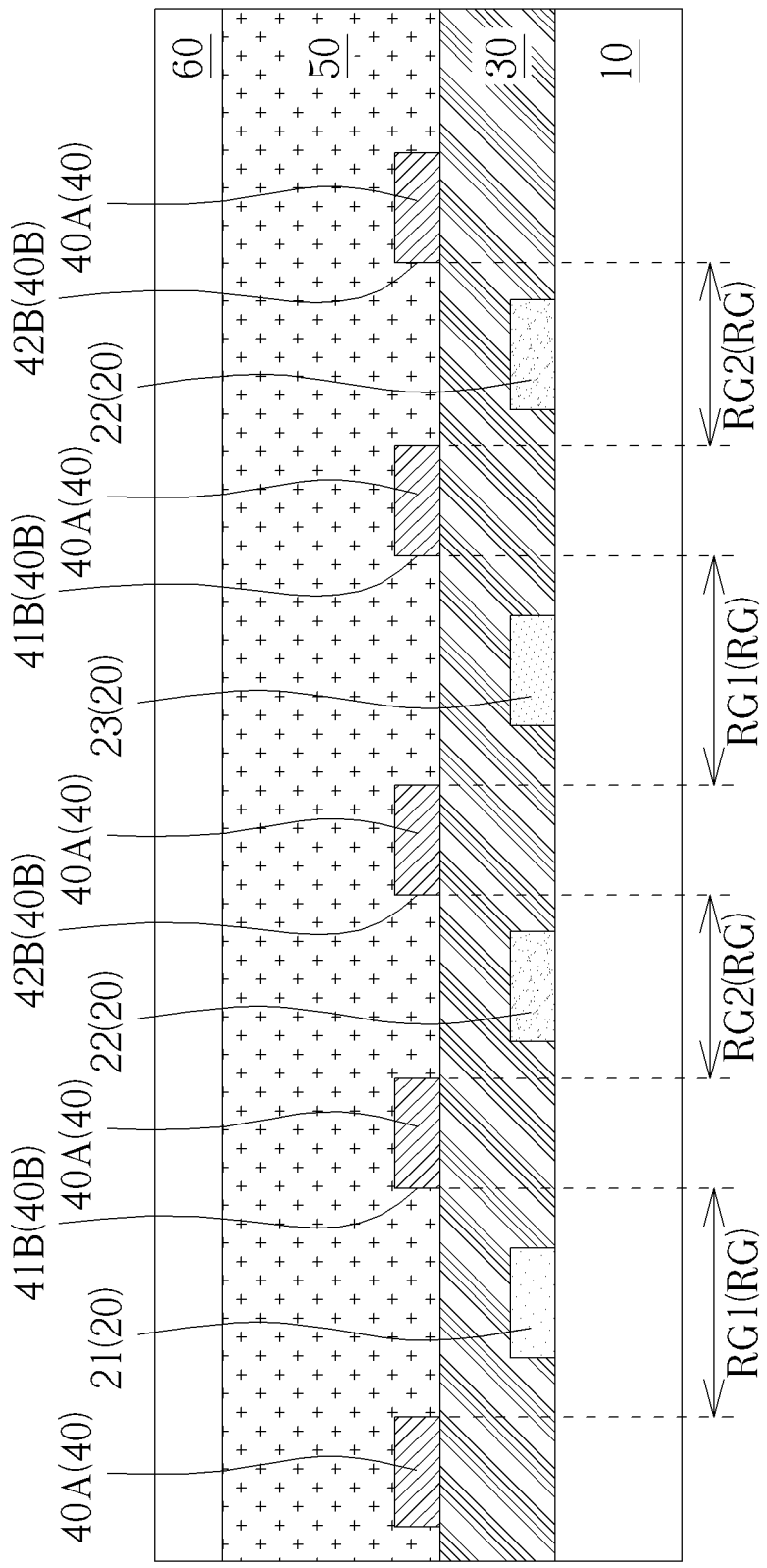
FIG. 2 is a cross-sectional diagram taken along a line A-A' in FIG. 1.

Please refer to FIG. 1 and FIG. 2. FIG. 1 is a schematic drawing illustrating a touch display device according to a first embodiment of the present disclosure. FIG. 2 is a cross-sectional diagram taken along a line A-A' in FIG. 1. As shown in FIG. 1 and FIG. 2, a touch display device 101 is provided in this embodiment. The touch display device 101 includes a substrate 10, a plurality of light emitting units 20, an insulation layer 30, and a plurality of mesh units 40. The plurality of the light emitting units 20 are disposed on the substrate 10. The insulation layer 30 is disposed on the plurality of the light emitting units 20. The plurality of the mesh units 40 are disposed on the insulation layer 30. Each of the mesh units 40 has a mesh frame 40A and a mesh opening 40B. In a top view diagram of the touch display device 101 (such as FIG. 1), the plurality of the light emitting units 20 are disposed in the mesh openings 40B.

In some embodiments, the substrate 10 may include a glass substrate, a plastic substrate, a ceramic substrate, a metal foil, or other suitable rigid or flexible substrates. The light emitting units 20 may include organic light emitting diode (OLED) units, light emitting diode (LED) units (such as inorganic micro LED, the critical dimension of micro LED is ranged from 0.1 um to 100 um), organic-inorganic mixture light emitting diode units (such as quantum dot LED), or other suitable types of light emitting structures. The outline of the light emitting units 20 in FIG. 1 is an effective lighting area defined by effective diode structure, and the effective diode structure is the sandwich stacking of cathode-emitting layer-anode. In addition, the substrate 10 may also include a circuit with a plurality of thin film transistors, or other appropriate circuit capable of driving the light emitting units 20. The thin film transistors of the circuit mentioned above may include amorphous silicon thin film transistors (a-Si TFTs), poly-silicon thin film transistors (poly-Si TFTs), an oxide semiconductor thin film transistors (such as IGZO TFTs), or other kinds of thin film transistors. In some embodiments, the insulation layer 30 may be an encapsulation layer formed on the substrate 10 and covering the light emitting units 20, but not limited thereto. In some embodiments, the insulation layer 30 may also include a planarization layer formed between the light emitting units 20 and an encapsulation layer covering the light emitting units 20. In other words, the insulation layer 30 could be single layer structure or multi-layered structure. The material of the insulation layer 30 may include silicon oxide, silicon nitride, silicon oxynitride, metal oxide, polymer, resin, or other suitable organic materials and inorganic materials. In some embodiments, the mesh units 40 may include metal mesh units, and the material of the metal mesh units may include aluminum (Al), copper (Cu), molybdenum (Mo), titanium (Ti), silver (Ag), a composition layer of the material mentioned above, or an alloy of the material mentioned above, but not limited thereto. In some embodiments, the mesh units 40 may also be made of other suitable conductive materials, such as oxide conductive materials.

As shown in FIG. 1 and FIG. 2, the mesh frame 40A of a mesh unit 40 may be connected with the mesh frame 40A of at least one of the adjacent mesh unit 40 to form a mesh shape. In other words, of the boundaries (dash lines) of the mesh units 40 are located between two adjacent mesh openings 40B, and the boundaries of the mesh units 40 are located on the mesh branches (connected electrode lines of the mesh shape). In some embodiments, a touch electrode 40X may be formed by at least one mesh unit 40. In other words, the touch display device 101 may include at least one touch electrode 40X formed by at least one mesh unit 40, but not limited thereto. The touch electrode 40X may be used to perform a capacitive touch sensing operation, a resistive touch sensing operation, or other suitable kinds of touch sensing operations. In some embodiments, the mesh units 40 may be used to form a connection part between the touch electrodes, a trace connected with the touch electrode and extending to the peripheral region, or other suitable portions of a touch sensing structure.

As shown in FIG. 1 and FIG. 2, each of the mesh openings 40B has a projection region RG in a direction Z perpendicular to the substrate 10, and the light emitting units 20 may be disposed within the projection regions RG. In other words, the mesh units 40 do not overlap the light emitting units 20 in the direction Z perpendicular to the substrate 10 for reducing the influence of the mesh units 40 on the display performance of the light emitting units 20, and the display quality of the touch display device 101 may be enhanced accordingly. A distance between each of the light emitting units 20 and the corresponding mesh frame 40A may be ranged from 1 um to 10 um in a top view diagram of the touch display device 101 for ensuring that the light emitted from the light emitting units 20 in the direction Z will not be block by the mesh unit 40. In some embodiments, each of the light emitting units 20 may be disposed within one of the projection regions RG of the mesh openings 40B respectively. In other words, each one of the projection regions RG may be formed corresponding to only one of the light emitting units 20, but not limited thereto. In some embodiments, at least one of the projection regions RG may also be formed corresponding to a plurality of the light emitting units 20.

Additionally, the light emitting units 20 may include different light emitting units configured to emit light beams of different colors. For example, the light emitting units 20 may include a first light emitting unit 21, a second light emitting unit 22, and a third light emitting unit 23 configured to emit red light, green light, and blue light respectively, but not limited thereto. In some embodiments, at least two of the light emitting units 20 have different areas, and the areas are defined within the outlines of the light emitting units 20. For example, the area of the third light emitting unit 23 may be less than the area of the first light emitting unit 21 and the area of the second light emitting unit 22 for specific color mixing considerations, but not limited thereto. Correspondingly, at least two of the mesh openings 40B may have different areas. Specifically, in some embodiments, the touch electrode 40X may include a plurality of first mesh units 41 and a plurality of second mesh units 42. Each of the first mesh units 41 may have a first mesh frame 41A and a first mesh opening 41B, and each of the second mesh units 42 may have a second mesh frame 42A and a second mesh opening 42B. The first light emitting unit 21 and the second light emitting units 22 may be disposed in the first mesh openings 41B respectively, and the third light emitting unit 23 may be disposed in the second mesh opening 42B. In other words, the first light emitting unit 21 may be disposed within a first projection region RG1 of the first mesh opening 41B, the second light emitting unit 22 may be disposed within the first projection region RG1 of another first mesh opening 41B, and the third light emitting unit 23 may be disposed within a second projection region RG2 of the second mesh opening 42B. When the area of the third light emitting unit 23 is smaller than the area of the first light emitting unit 21 and the area of the second light emitting unit 22, the second mesh opening 42B may be smaller than the first mesh opening 41B, and the second projection region RG2 may be smaller than the first projection region RG1, but not limited thereto. In some embodiments, the first light emitting unit 21 may be disposed in the first mesh openings 41B, the second light emitting unit 21 may be disposed in the second mesh openings 42B, and the third light emitting unit 23 may be disposed in a third mesh opening, the area of the third light emitting unit 23 is smaller than the area of the second light emitting unit 21, the area of the second light emitting unit 23 is smaller than the area of the first light emitting unit 21, the third mesh opening may be smaller than the second mesh opening 42B, the second mesh opening 42B may be smaller than the first mesh opening 41A. In some embodiments, the areas of the mesh openings 40B may also be equal to one another for other design considerations.

As shown in FIG. 1 and FIG. 2, the touch display device 101 may further include a cover substrate 60 and an adhesive layer 50. The adhesive layer 50 may be disposed between the cover substrate 60 and the substrate 10 having the light emitting units 20 and the mesh units 40 disposed thereon for combining the substrate 10 with the cover substrate 60. Accordingly, the mesh units 40 are disposed between the cover substrate 60 and the insulation layer 30. In some embodiments, the touch display device 101 may further include a polarizer and/or a quarter-wave plate (not shown) disposed between the cover substrate 60 and the light emitting units 20 or disposed on the cover substrate 60 for reducing the influence of the ambient light reflected by the touch display device 101, but not limited thereto.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 3:
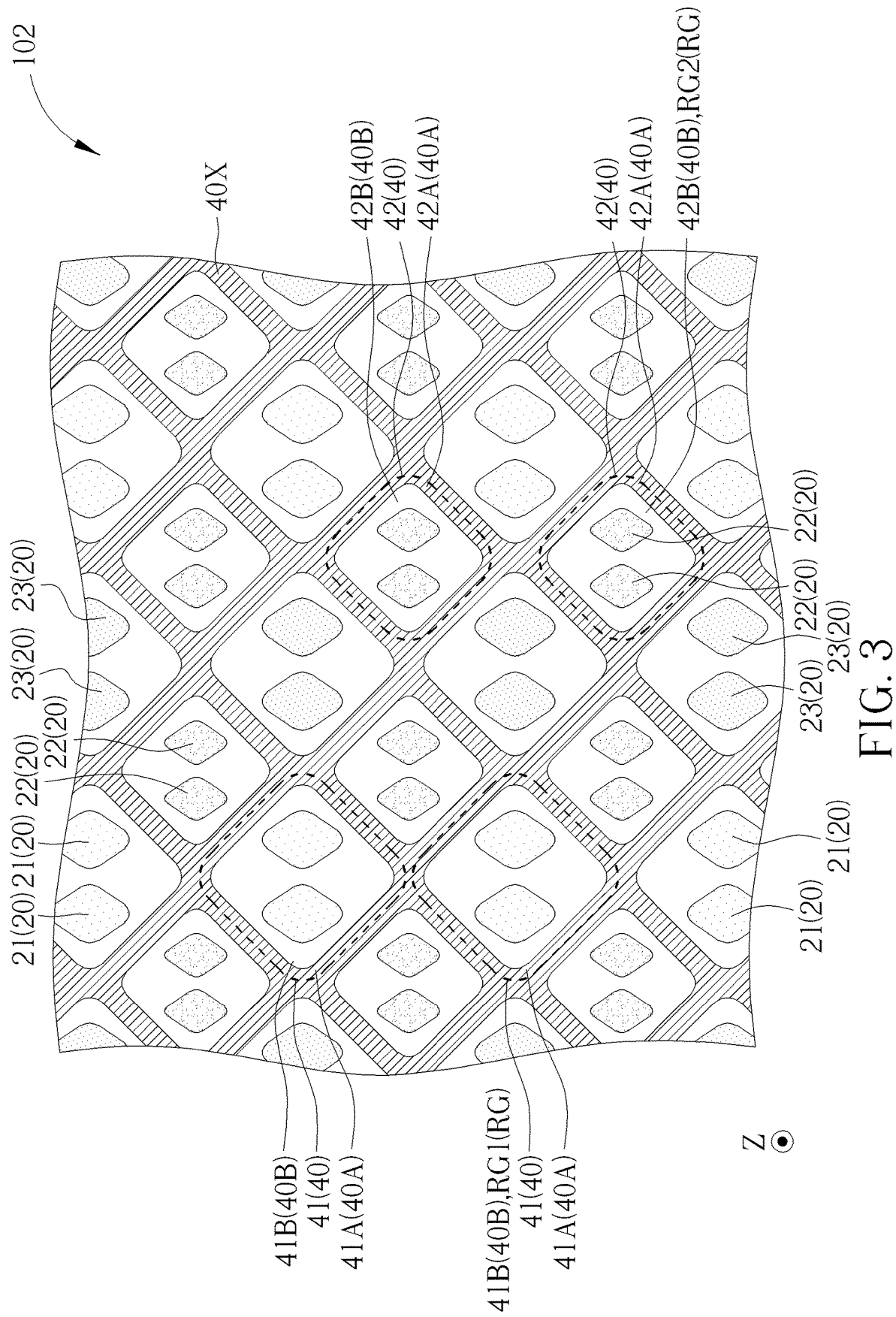
FIG. 3 is a schematic drawing illustrating a touch display device according to a second embodiment of the present disclosure.

Please refer to FIG. 3. FIG. 3 is a schematic drawing illustrating a touch display device 102 according to a second embodiment of the present disclosure. As shown in FIG. 3, in the touch display device 102, at least two of the light emitting units 20 are disposed in one of the mesh openings 40B. In other words, at least two of the light emitting units 20 are disposed within one of the projection regions RG of the mesh openings 40B. For example, each one of the projection regions RG may be formed corresponding to two of the light emitting units 20, but not limited thereto. In some embodiments, there may be more than two of the light emitting units 20 disposed in the same mesh opening 40B. Additionally, the light emitting units 20 disposed within the same projection region RG may be configured to emit light beams of the same color, but not limited thereto. For example, two of the first light emitting units 21 may be disposed within the same first projection region RG1, two of the second light emitting units 22 may be disposed within the same first projection region RG1, and two of the third light emitting units 23 may be disposed within the same second projection region RG2.

Figure 4:
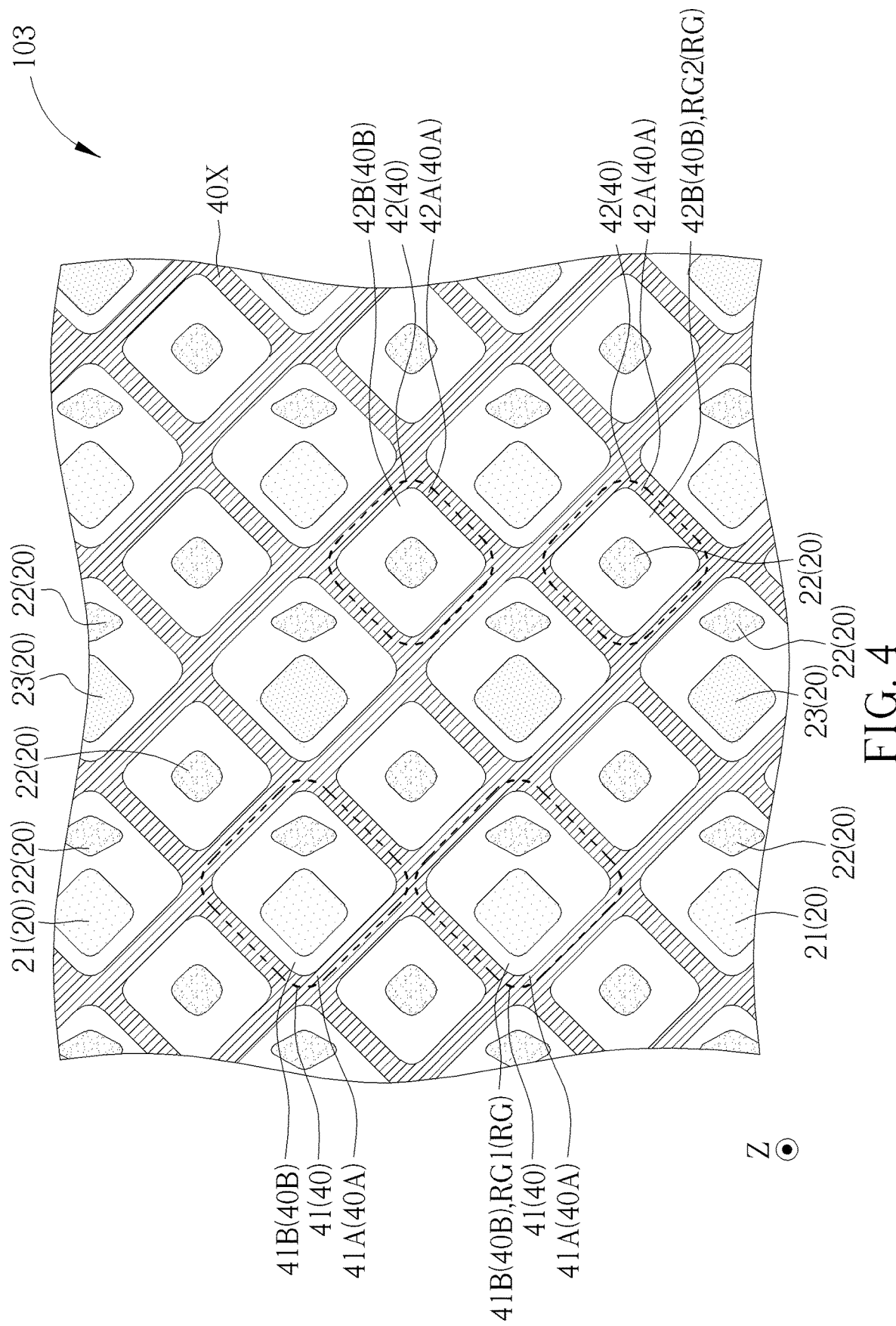
FIG. 4 is a schematic drawing illustrating a touch display device according to a third embodiment of the present disclosure.

Please refer to FIG. 4. FIG. 4 is a schematic drawing illustrating a touch display device 103 according to a third embodiment of the present disclosure. As shown in FIG. 4, in the touch display device 103, at least two of the light emitting units 20 are disposed in one of the mesh openings 40B. In other words, at least two of the light emitting units 20 are disposed within one of the projection regions RG of the mesh openings 40B. Additionally, the amounts of the light emitting units 20 disposed within at least two of the projection regions RG respectively may be different from one another. For example, there may be only one of the light emitting units 20 disposed in each of the second mesh openings 42B, and there may be two of the light emitting units 20 disposed in each of the first mesh openings 41B. Additionally, the light emitting units 20 disposed within the same projection region RG may be configured to emit light beams of different colors. For example, one of the first light emitting units 21 and one of the third light emitting units 23 may be disposed within the same first projection region RG1, and one of the second light emitting units 22 and one of the third light emitting units 23 may be disposed within the same first projection region RG1, but not limited thereto.

Figure 5:
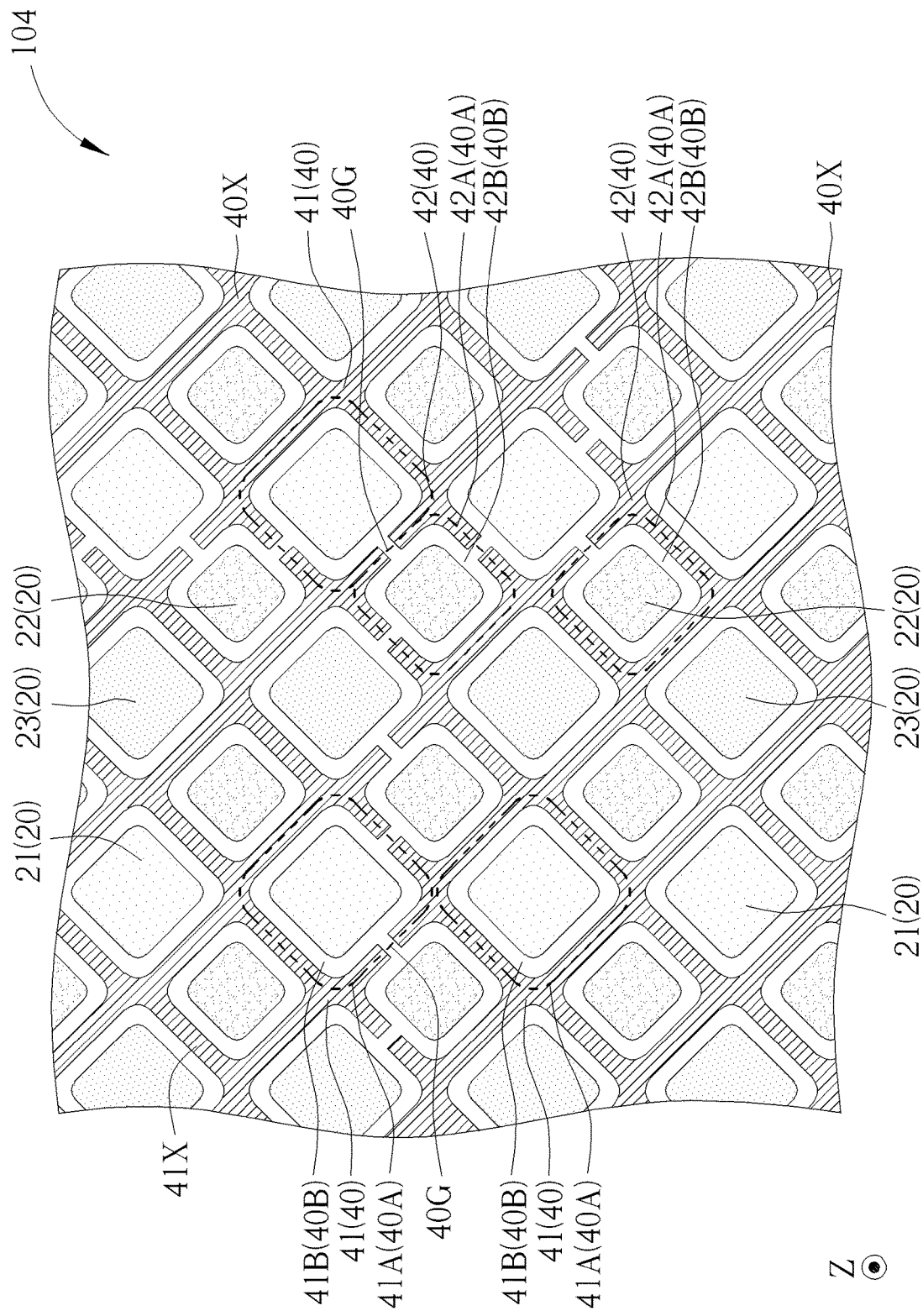
FIG. 5 is a schematic drawing illustrating a touch display device according to a fourth embodiment of the present disclosure.
Figure 6:
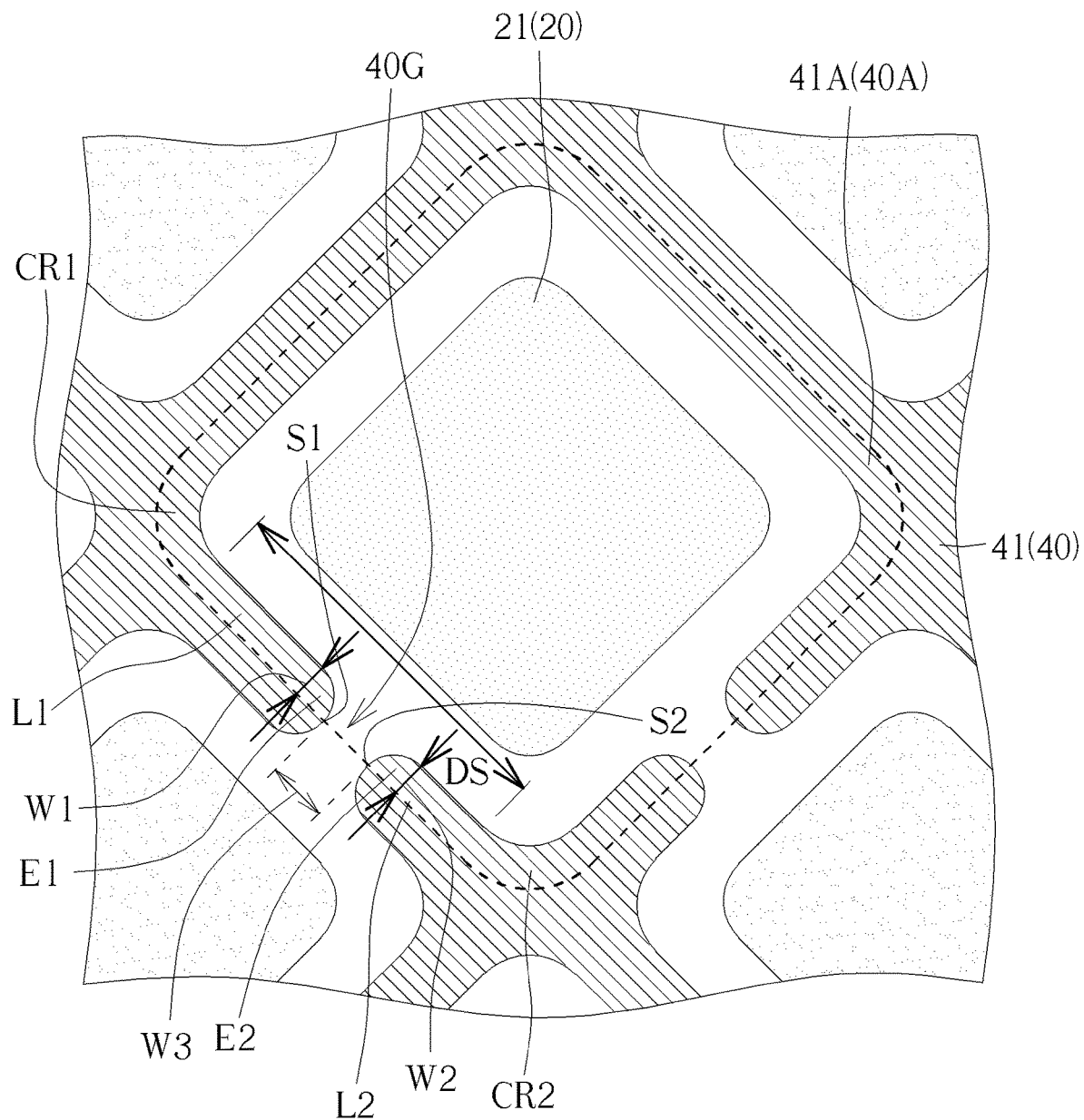
FIG. 6 is a schematic drawing illustrating a mesh unit according to the fourth embodiment of the present disclosure.

Please refer to FIG. 5 and FIG. 6. FIG. 5 is a schematic drawing illustrating a touch display device 104 according to a fourth embodiment of the present disclosure. FIG. 6 is a schematic drawing illustrating a mesh unit in this embodiment. As shown in FIG. 5 and FIG. 6, in the touch display device 104, at least one of the mesh frames 40A includes a first end portion E1 and a second end portion E2 opposite to the first end portion E1, and a gap 40G is a minimum distance disposed between the first end portion E1 and the second end portion E2. The gaps 40G may be used to separate two adjacent touch electrodes 40X composed of the mesh units 40, but not limited thereto. Accordingly, the first end portion E1 may be electrically isolated from the second end portion E2, but not limited thereto. In some embodiments, there may be only one gap 40G disposed in one of the mesh units 40, and the first end portion E1 may be still electrically connected to the second end portion E2. Additionally, the mesh frame 40A may further include a first mesh corner CR1, a second mesh corner CR2, a first line portion L1 and a second line portion L2. The first line portion L1 is disposed between the first end portion E1 and the first mesh corner CR1. The second line portion L2 is disposed between the second end portion E2 and the second mesh corner CR2. The shape of the first line portion L1 and the second line portion L2 is rectangular. At least a portion of the first end portion E1, the second end portion E2, the first mesh corner CR1, and the second mesh corner CR2 are curved. The first mesh corner CR1 is adjacent to the second corner CR2, and the gap 40G is disposed between the first mesh corner CR1 and the second mesh corner CR2. The first line portion L1 may have a first width W1 in a direction perpendicular to the extending direction of the first line portion L1, and the second line portion L2 may have a second width W2 in a direction perpendicular to the extending direction of the second line portion L2. The first width W1 and the second width W2 may be less than or equal to the width of the gap 40G, such as a third width W3 shown in FIG. 6. In addition, the width of the gap 40G may be smaller than a distance DS between the first mesh corner CR1 and the second mesh corner CR2 for lowering the visual influence of the gap 40G. The distance DS is a minimum distance between the first mesh corner CR1 and the second mesh corner CR2. In some embodiments, the first end portion E1 may have a first curved edge S1, and the second end portion E2 may have a second curved edge S2, but not limited thereto.

Figure 7:
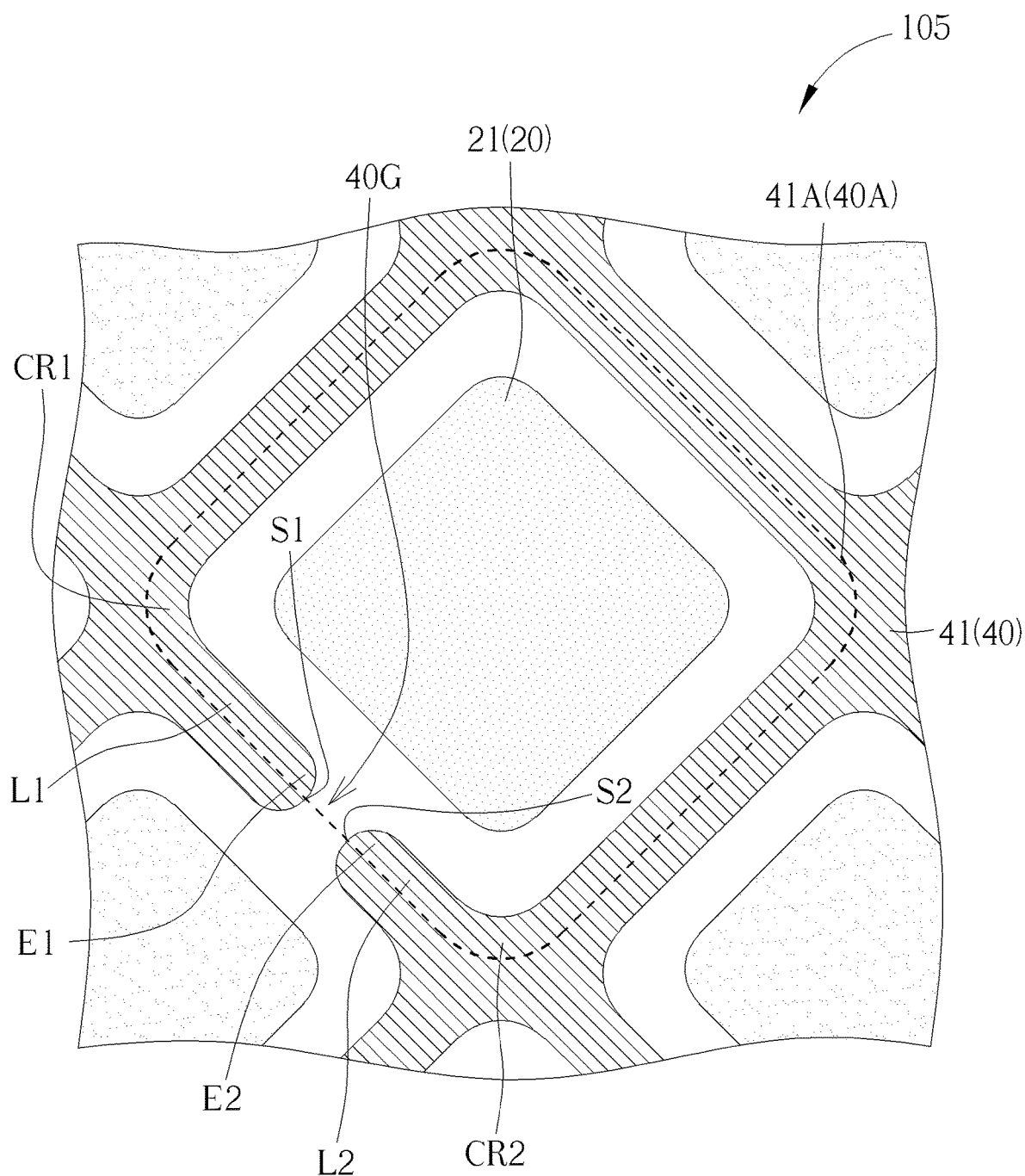
FIG. 7 is a schematic drawing illustrating a touch display device according to a fifth embodiment of the present disclosure.

Please refer to FIG. 7. FIG. 7 is a schematic drawing illustrating a touch display device 105 according to a fifth embodiment of the present disclosure. As shown in FIG. 7, in the touch display device 105, there may be only one gap 40G disposed in one of the mesh units 40, and the first end portion E1 may be still electrically connected to the second end portion E2. The mesh unit 40 shown in FIG. 7 may be a dummy mesh unit in the touch sensing structure, and the gap 40G may be formed for improving the visual uniformity of the mesh units 40, but not limited thereto.

To summarize the above descriptions, in the touch display device of the present disclosure, the light emitting units are disposed in the mesh openings of the mesh units for preventing the light emitted from the light emitting units from being blocked by the mesh units in the direction perpendicular to the substrate. The light emitting strength of the touch display device may be enhanced, and the display quality of the touch display device may be improved accordingly.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A touch display device, comprising:
    a substrate;
    a plurality of first light emitting units disposed on the substrate;
    a plurality of second light emitting units disposed on the substrate and being greater than the plurality of first light emitting units in area;
    an insulation layer disposed on the plurality of first light emitting units and the plurality of second light emitting units; and
    a plurality of mesh units disposed on the insulation layer, each of the plurality of mesh units having a mesh frame and a mesh opening, and at least one of the plurality of first light emitting units and at least one of the plurality of second light emitting units being disposed in the mesh opening respectively in a direction perpendicular to the substrate,
    wherein at least one of the plurality of mesh frames comprises a first end portion, a second end portion opposite to the first end portion, a first mesh corner, a second mesh corner adjacent to the first mesh corner, and a first line portion disposed between the first mesh corner and the first end portion, wherein a gap is disposed between the first end portion and the second end portion, the gap is disposed between the first mesh corner and the second mesh corner, and the first end portion is electrically connected to the second end portion, wherein the plurality of first light emitting units are configured to emit green light, and the plurality of second light emitting units are configured to emit red light, wherein the first mesh corner is curved and the second mesh corner is curved,
    wherein the plurality of mesh units comprise a first mesh unit including a first mesh opening and a second mesh unit including a second mesh opening, at least one of the plurality of first light emitting units is disposed in the first mesh opening in the direction perpendicular to the substrate, and at least one of the plurality of second light emitting units is disposed in the second mesh opening in the direction perpendicular to the substrate, wherein an area of the second mesh opening is greater than an area of the first mesh opening.

2. The touch display device of claim 1, wherein the first line portion has a first width, and the first width is less than a width of the gap.

3. The touch display device of claim 1, wherein the first end portion has a first curved edge, and the second end portion has a second curved edge.

4. The touch display device of claim 1, wherein the insulation layer is an encapsulation layer covering the plurality of first light emitting units and the plurality of second light emitting units.

5. The touch display device of claim 1, wherein at least another one of the plurality of mesh frames comprises a third end portion and a fourth end portion opposite to the third end portion, another gap is disposed between the third end portion and the fourth end portion, and the third end portion is electrically disconnected to the fourth end portion.

6. The touch display device of claim 1, wherein the at least one of the plurality of mesh frames further comprises a second line portion disposed between the second mesh corner and the second end portion.

7. The touch display device of claim 1, wherein each of the plurality of first light emitting units or each of the plurality of second light emitting units comprises organic light emitting units, inorganic light emitting units, or organic-inorganic mixture light emitting units.

8. The touch display device of claim 1, wherein at least one touch electrode is composed of a part of the plurality of mesh units.

9. The touch display device of claim 1, wherein the plurality of mesh units comprise a plurality of metal mesh units.

10. The touch display device of claim 1, further comprising:
    a cover substrate, wherein the plurality of mesh units are disposed between the cover substrate and the insulation layer.

* * * * *